(12) United States Patent
Weng et al.

(10) Patent No.: US 7,192,878 B2
(45) Date of Patent: Mar. 20, 2007

(54) METHOD FOR REMOVING POST-ETCH RESIDUE FROM WAFER SURFACE

(75) Inventors: Cheng-Ming Weng, Hsin-Chu Hsien (TW); Miao-Chun Lin, Tainan Hsien (TW); Chun-Jen Huang, Tainan Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/908,374

(22) Filed: May 9, 2005

(65) Prior Publication Data
US 2006/0252256 A1 Nov. 9, 2006

(51) Int. Cl.
*H01L 21/302* (2006.01)
*H01L 21/461* (2006.01)

(52) U.S. Cl. ............... 438/734; 438/711; 438/637; 438/906; 438/963; 257/E21.229; 257/E21.577

(58) Field of Classification Search ........... 438/637, 438/704, 711, 734, 906, 700, 672, 963; 216/55, 216/57, 109, 104; 134/1.1–1.3
See application file for complete search history.

(56) References Cited

U.S. PATENT DOCUMENTS

| | | | | |
|---|---|---|---|---|
| 5,972,862 | A * | 10/1999 | Torii et al. | 510/175 |
| 6,331,479 | B1 * | 12/2001 | Li et al. | 438/618 |
| 6,465,352 | B1 | 10/2002 | Aoki | |
| 6,569,777 | B1 * | 5/2003 | Hsu et al. | 438/725 |
| 6,638,871 | B2 | 10/2003 | Wang et al. | |
| 6,647,995 | B1 * | 11/2003 | Huang et al. | 134/1.3 |
| 6,740,585 | B2 * | 5/2004 | Yoon et al. | 438/680 |
| 6,783,695 | B1 * | 8/2004 | Torek et al. | 252/79.1 |
| 6,797,627 | B1 | 9/2004 | Shih et al. | |
| 6,848,455 | B1 * | 2/2005 | Shrinivasan et al. | 134/1.3 |
| 2003/0224595 | A1 * | 12/2003 | Smith et al. | 438/637 |
| 2004/0127016 | A1 * | 7/2004 | Hoog et al. | 438/637 |
| 2004/0211665 | A1 * | 10/2004 | Yoon et al. | 204/298.01 |
| 2005/0045206 | A1 * | 3/2005 | Smith et al. | 134/16 |
| 2005/0079717 | A1 * | 4/2005 | Savas et al. | 438/689 |
| 2005/0079719 | A1 * | 4/2005 | Colburn et al. | 438/694 |
| 2005/0101125 | A1 * | 5/2005 | Smith et al. | 438/637 |
| 2005/0266681 | A1 * | 12/2005 | Dalton et al. | 438/637 |

OTHER PUBLICATIONS

Ghandhi, Sorab K., VLSI Fabrication Principles: Silicon and Gallium Arsenide, 1994, Wiley-Interscience, $2^{nd}$ edtion, p. 622-623.*

* cited by examiner

*Primary Examiner*—George R. Fourson
*Assistant Examiner*—John M. Parker
(74) *Attorney, Agent, or Firm*—Winston Hsu

(57) ABSTRACT

A low-k dielectric film is deposited on the wafer. A metal layer is then deposited over the low-k dielectric film. A resist pattern is formed over the metal layer. The resist pattern is then transferred to the underlying metal layer to form a metal pattern. The resist pattern is stripped off. A through hole is plasma etched into the low-k dielectric film by using the metal pattern as a hard mask. The plasma etching causes residues to deposit within the through hole. A first wet treatment is then performed to soften the residues. A plasma dry treatment is carried out to crack the residues. A second wet treatment is performed to completely remove the residues.

20 Claims, 9 Drawing Sheets

METHOD FOR REMOVING POST-ETCH RESIDUE FROM WAFER SURFACE

BACKGROUND OF INVENTION

1. Field of the Invention

The present invention relates to the field of semiconductor fabrication and, more particularly, to a method for removing post-etch residues in a trench/via opening, which is etched into low-k dielectric films with at least one metal layer as a hard mask.

2. Description of the Prior Art

As pitches between interconnection wirings of integrated circuits shrink to very deep sub-micron scale or beyond, post-etch trench/via residual looms as a major issue regarding the success in damascene or dual damascene processes. Several prior arts have addressed this problem.

For example, U.S. Pat. No. 6,797,627 filed Dec. 5, 2001 to Shih et al. discloses a dry-wet-dry solvent-free process for removing polymer residuals, which are allegedly mixed with copper oxide substances, from the damascened trench/via bottom and sidewalls. The proposed method is carried out after the nitride or carbide cap layer exposed by the via opening is removed. This invention limits itself to C—F based and Cu—F based polymers that are formed as part of the process of removing the cap layer from the bottom surface of an opening that has been created through one or more layers of low-k dielectrics.

According to U.S. Pat. No. 6,797,627, as set forth in the claims thereto, the proposed method must start with an $O_2$—, $N_2$—, or $H_2$-based plasma treatment that interacts with polymer residuals and must create water-soluble byproducts. A de-ionized water rinse follows to remove the water-soluble byproducts and polymer from the sidewalls of the via opening. A reducing $H_2$-based plasma treatment is then carried out to reduce copper oxide and to remove the polymer from the bottom of the via opening.

U.S. Pat. No. 6,465,352 filed Jun. 12, 2000 to Aoki discloses a dry-wet process for removing the resist film and dry-etching residue in a semiconductor device fabrication process. The proposed method starts with a $H_2/N_2$ plasma treatment, followed by an amine-based wet treatment. According to this patent, the $H_2/N_2$ plasma treatment changes the properties of a so-called resist surface hardened layer such that it can be removed later, along with the etching residue, by the succeeding amine-based wet treatment.

However, the results presented by the aforesaid prior art methods have been proven to be not satisfactory, particularly in some circumstances when a metal hard mask is applied during the etching of a trench/via hole in the dual damascene processes. The state-of-the-art metal hard mask technology may be found in, for example, U.S. Pat. No. 6,638,871 filed Jan. 10, 2002 to Wang et al., which is assigned to the same party as that of the present application, and which discloses a damascene process involving the use of a stacked dielectric-metal-dielectric hard mask.

It is believed that the composition of the trench/via residuals, which are produced when the trench/via hole is etched into low-k dielectric films with a metal layer such as titanium or titanium nitride as a hard mask, has become much more complex than ever. Therefore, it is difficult to remove such trench/via residuals by using traditional approaches.

Hitherto, the newly formulated polymer residuals arose due to the use of a metal hard mask and the solution to effectively remove such polymer residuals are not yet addressed by any of the prior arts. Hence, there is a need in this industry to provide an improved method for eliminating such newly formulated polymer residuals without adversely affecting the performance of the integrated circuit.

SUMMARY OF INVENTION

It is the primary object of the present invention to provide an improved method for effectively removing post-etch residues in a trench/via opening.

It is another object of the present invention to provide a method for effectively removing post-etch residues in a trench/via opening, which is etched into low-k dielectric films with at least one metal layer as a hard mask.

According to one aspect of the present invention, one preferred embodiment discloses a method for removing post-etch residues from surfaces of a wafer. A low-k (k<3) dielectric film is deposited on the wafer. A metal layer is then deposited over the low-k dielectric film. A resist pattern is formed over the metal layer. The resist pattern is then transferred to the underlying metal layer to form a metal pattern. The resist pattern is stripped off. A through hole is plasma etched into the low-k dielectric film by using the metal pattern as a hard mask. The plasma etching causes residues to deposit within the through hole. A first wet treatment is then performed to soften the residues. A plasma dry treatment is carried out to crack the residues. A second wet treatment is performed to completely remove the residues.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention pertains to an improved method for effectively removing post-etch residues in a trench/via opening or through hole, which is etched into low-k dielectric film(s) with at least one metal layer as a hard mask for the etching of the through hole. Since a metal hard mask is newly introduced into the damascene processes, it is believed that the resultant post-etch residues would have a newly formulated composition such as complex organic metal compounds that are not possible to be eliminated by virtue of the traditional dry-wet-dry or dry-wet process.

According to the present invention, a wet-dry-wet process is proposed to effectively removing the post-etch residues from the wafer. More specifically, the present invention discloses a wet-dry-wet process comprising a first wet treatment, followed by an aggressive oxidizing plasma treatment, then a reducing plasma treatment, and finally a second wet treatment. Both the first and second wet treatments involve the use of fluoride-based solvent.

The present invention wet-dry-wet or wet-dry-dry-wet method is preferably carried out in the absence of a photo resist film on the treated wafer, but should not be limited thereto.

Figure 1:
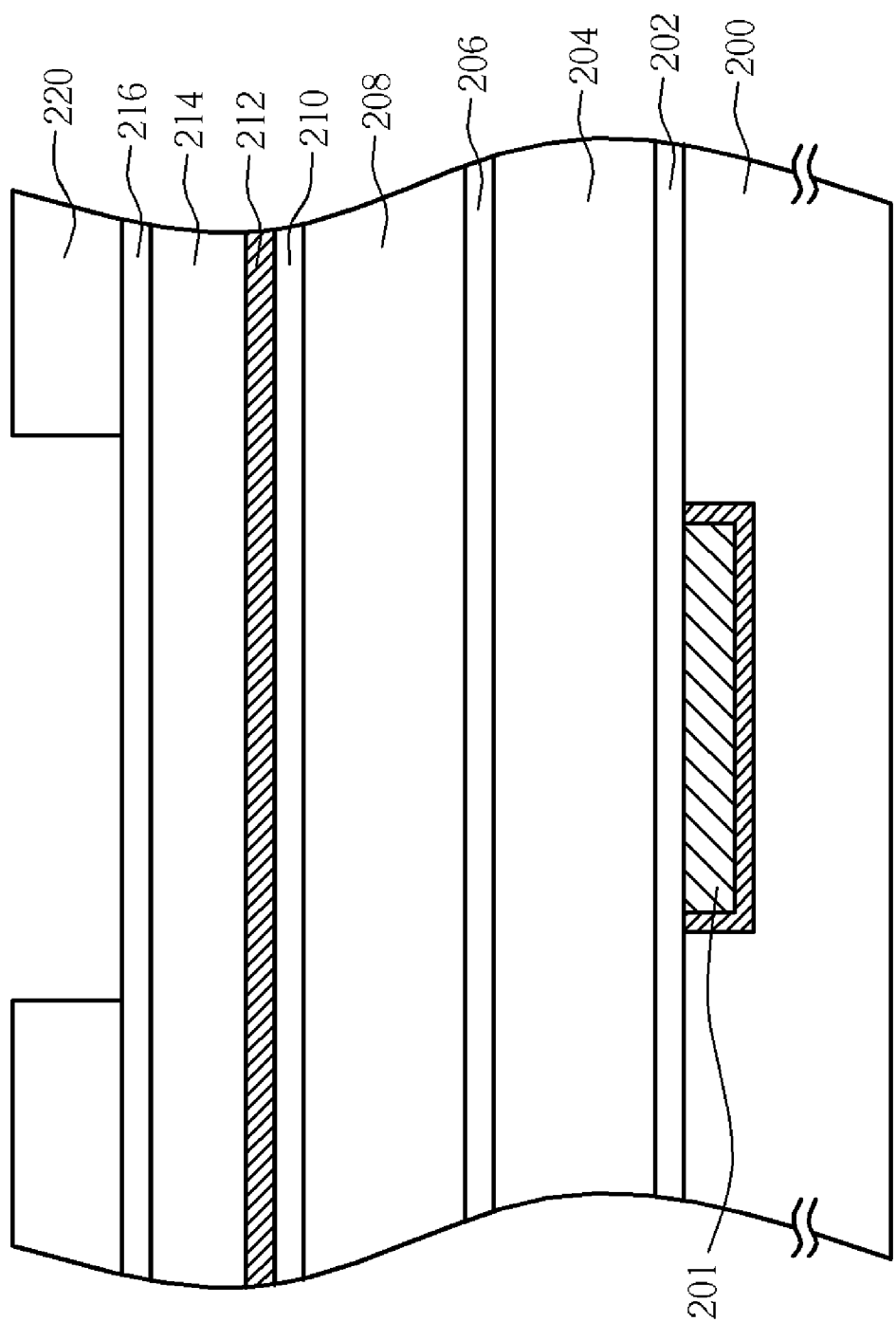
FIGS. 1 to 8 are schematic, cross-sectional diagrams of the process steps for forming a damascene opening in low-k dielectric layers according to one preferred embodiment of this invention.

FIGS. 1 to 8 are schematic, cross-sectional diagrams of the process steps for forming a damascene opening in low-k dielectric layers according to one preferred embodiment of this invention. As shown in FIG. 1, a semiconductor substrate 200 having metal wire 201 formed thereon is provided. A cap layer 202 is formed over the substrate 200 and the metal wires 201. The cap layer is, for example, a silicon nitride layer with a thickness of about 300–700 angstroms. A first dielectric layer 204, an etch stop layer 206 and a second dielectric layer 208 are formed in sequence on the cap nitride layer 202. The first and second dielectric layers 204 and 208 are made of low-k dielectric materials such as CORAL™ or Black Diamond™. Preferably, the dielectric constant k of the first and second dielectric layers 202 and 208 is smaller than 3.0 (k<3). The etch stop layer 206 is, for example, a silicon nitride layer or a silicon carbide layer with a thickness of about 300–700 angstroms.

Still referring to FIG. 1, a chemical mechanical polishing (CMP) stop layer 210, a metal hard mask layer 212, a dielectric hard mask layer 214 and a bottom anti-reflection coating (BARC) layer 216 are formed in sequence on the second dielectric layer 208. The CMP stop layer 210 is, for example, a silicon nitride layer or a silicon carbide layer with a thickness of about 400–700 angstroms. Suitable materials for the metal hard mask layer 212 include tantalum, tantalum nitride, tungsten, tungsten nitride, titanium nitride and titanium. The metal hard mask layer 212 has a thickness of about 100–300 angstroms. The hard mask layer 214 is, for example, a silicon nitride layer or a silicon carbide layer with a thickness of about 1000–2000 angstroms. Subsequently, a patterned first photoresist layer 220 is formed on the BARC layer 216.

Figure 2:
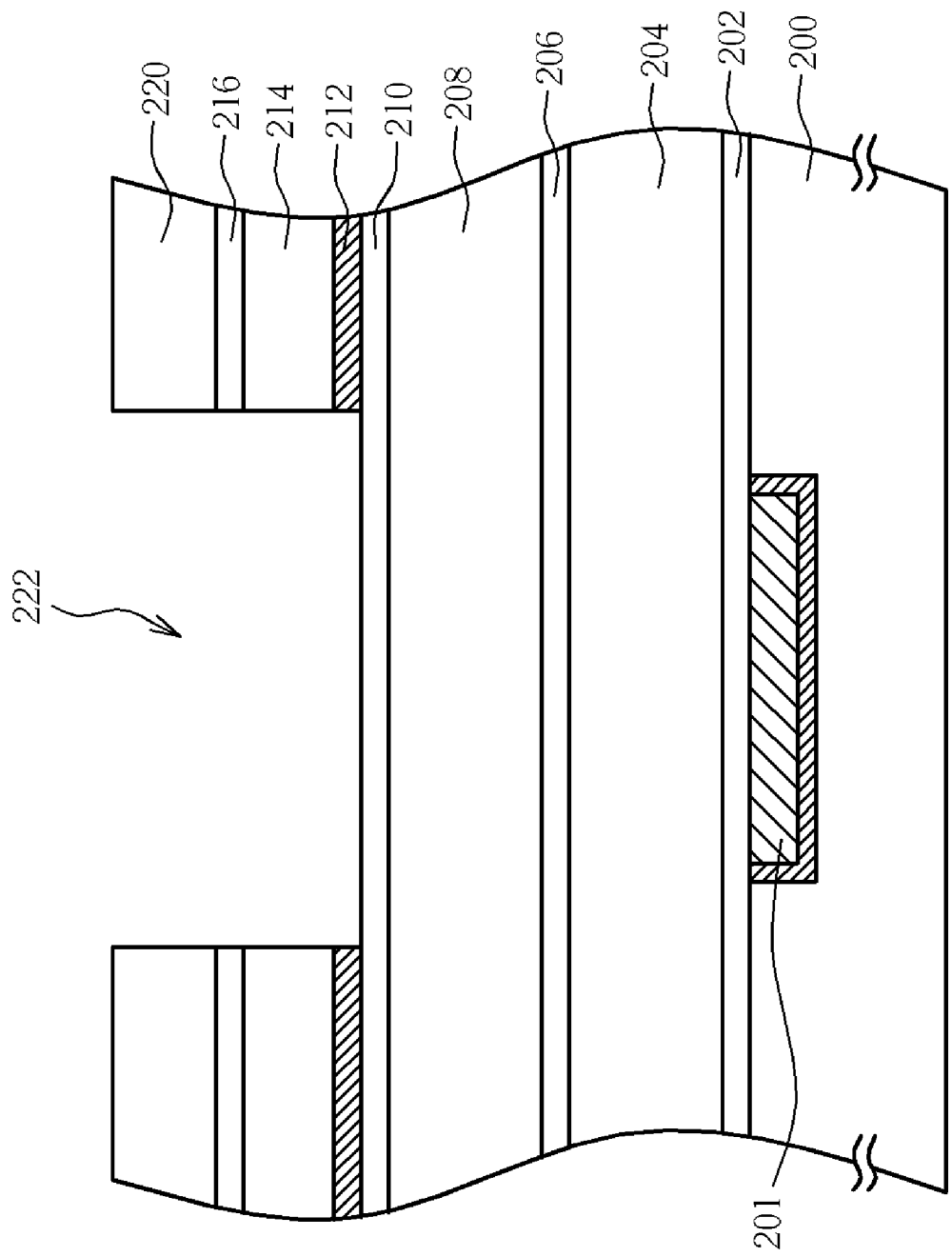

As shown in FIG. 2, using the patterned photoresist layer (defining a trench pattern) 220 as a mask, the BARC layer 216, the hard mask layer 214 and the metal hard mask layer 212 are partially removed until the underlying CMP stop layer 210 is exposed. An opening 222 is thus formed within the BARC layer 216, the patterned hard mask layer 214 and the metal hard mask layer 212.

Figure 3:
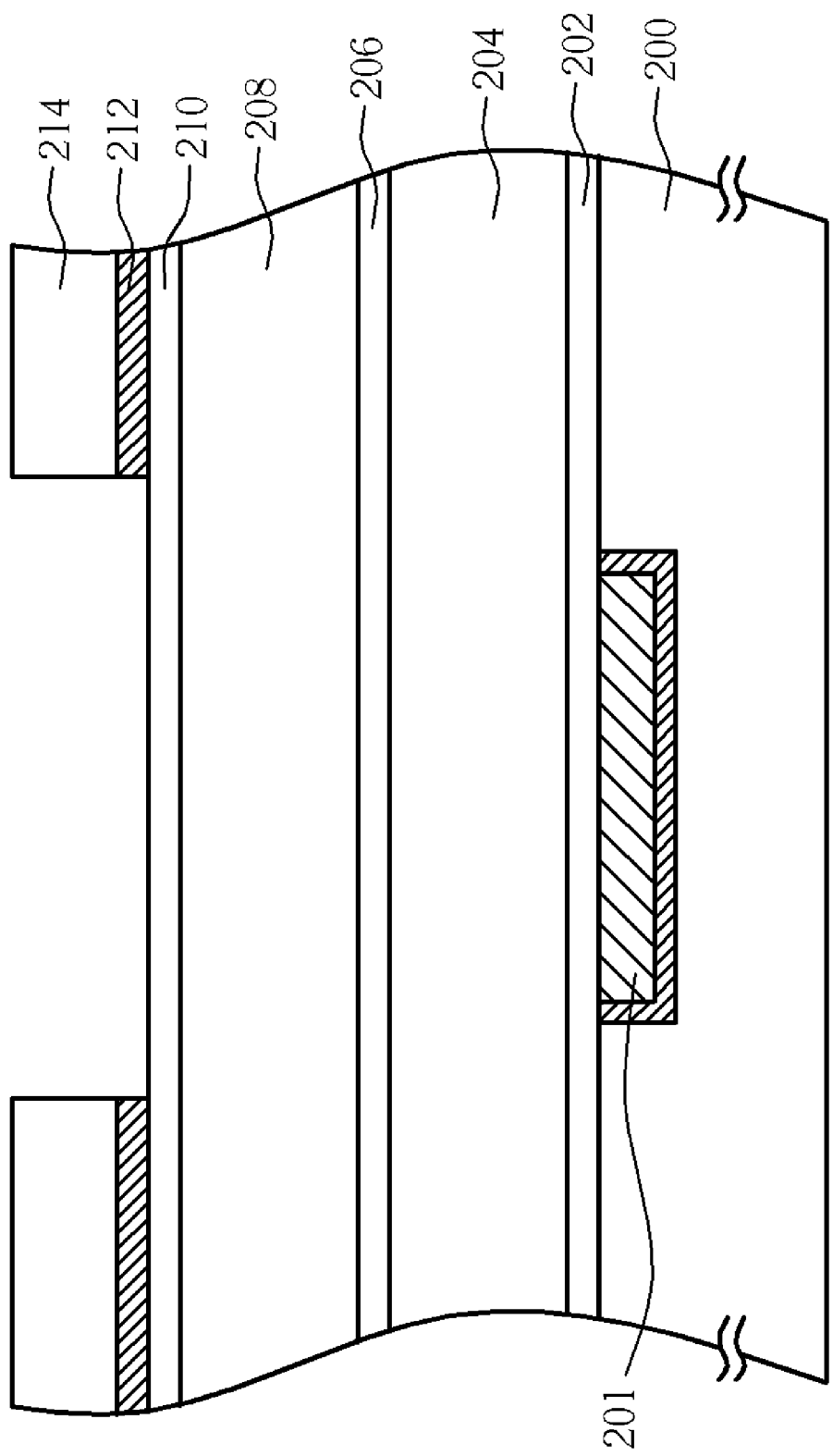

As shown in FIG. 3, the photoresist layer 220 and the BARC layer 216 are stripped off. At this stage, the dielectric layer 208 is still covered and protected by the CMP stop layer 21 0 from being damaged by plasma ashing process used to remove the photoresist layer 220 and the BARC layer 216.

Figure 4:
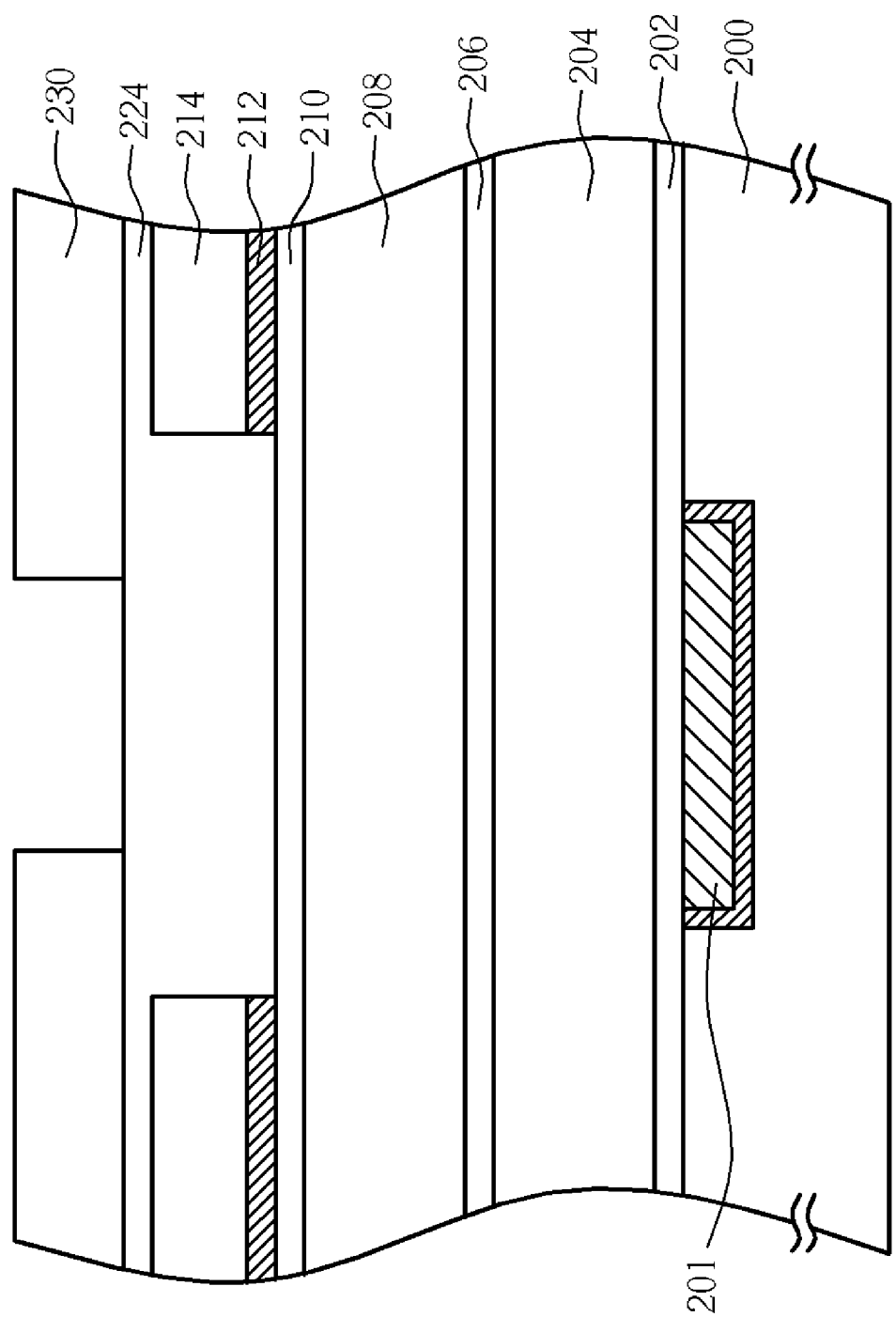
Figure 5:
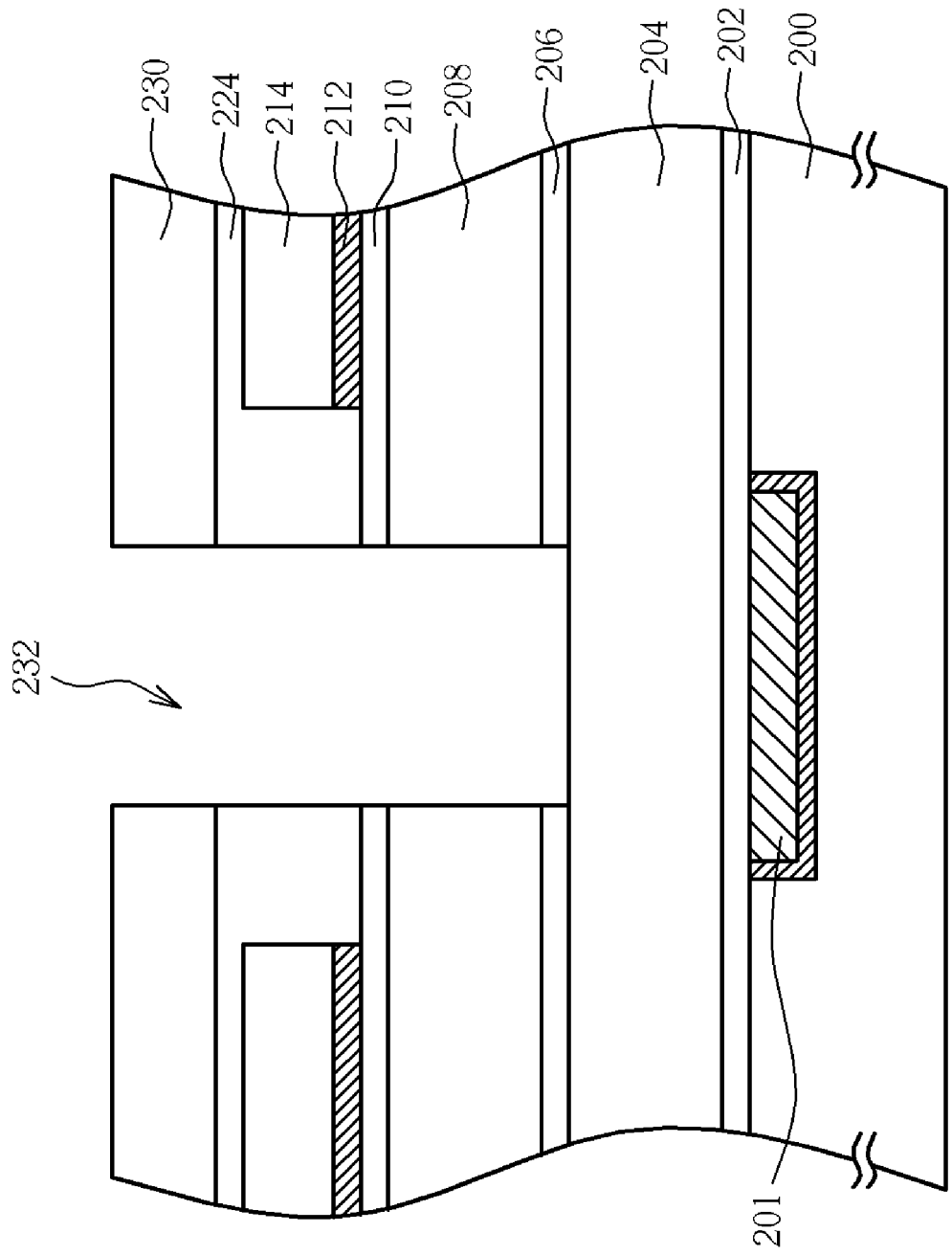

As shown in FIG. 4, a BARC layer 224 is formed on the patterned hard mask layer 214 and on the exposed CMP stop layer 210, and fills the opening 222. A patterned photoresist layer (defining a via pattern) 230 is then formed on the BARC layer 224. As shown in FIG. 5, using the photoresist layer 230 as a mask, an anisotropic etching process is performed to remove the BARC material layer 224, the CMP stop layer 210, the second dielectric layer 208 and the etch stop layer 206, forming a via opening 232 therein.

Figure 6:
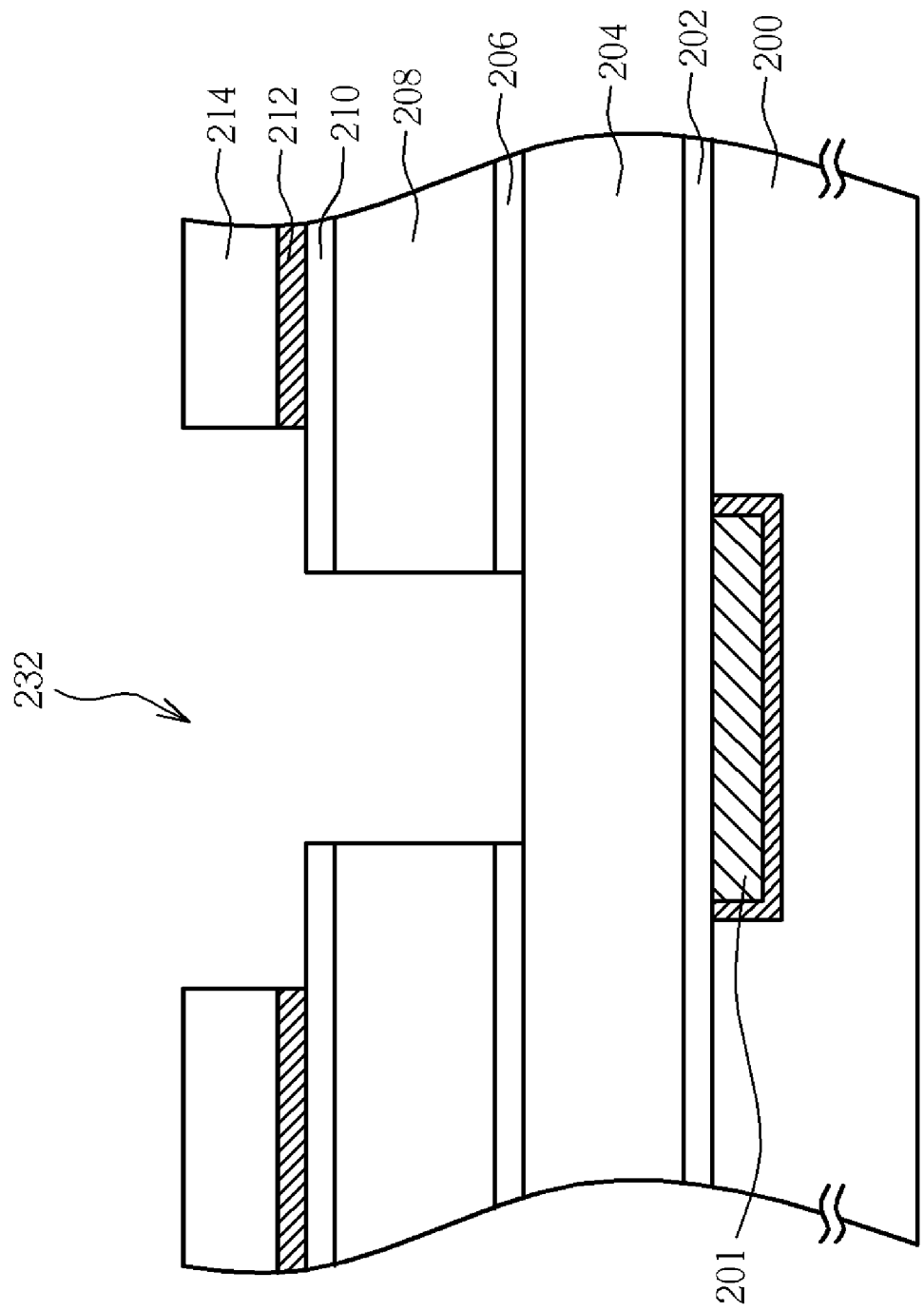

As shown in FIG. 6, a conventional plasma ashing process is performed to remove the photoresist layer 230 and the BARC material layer 224.

Figure 7:
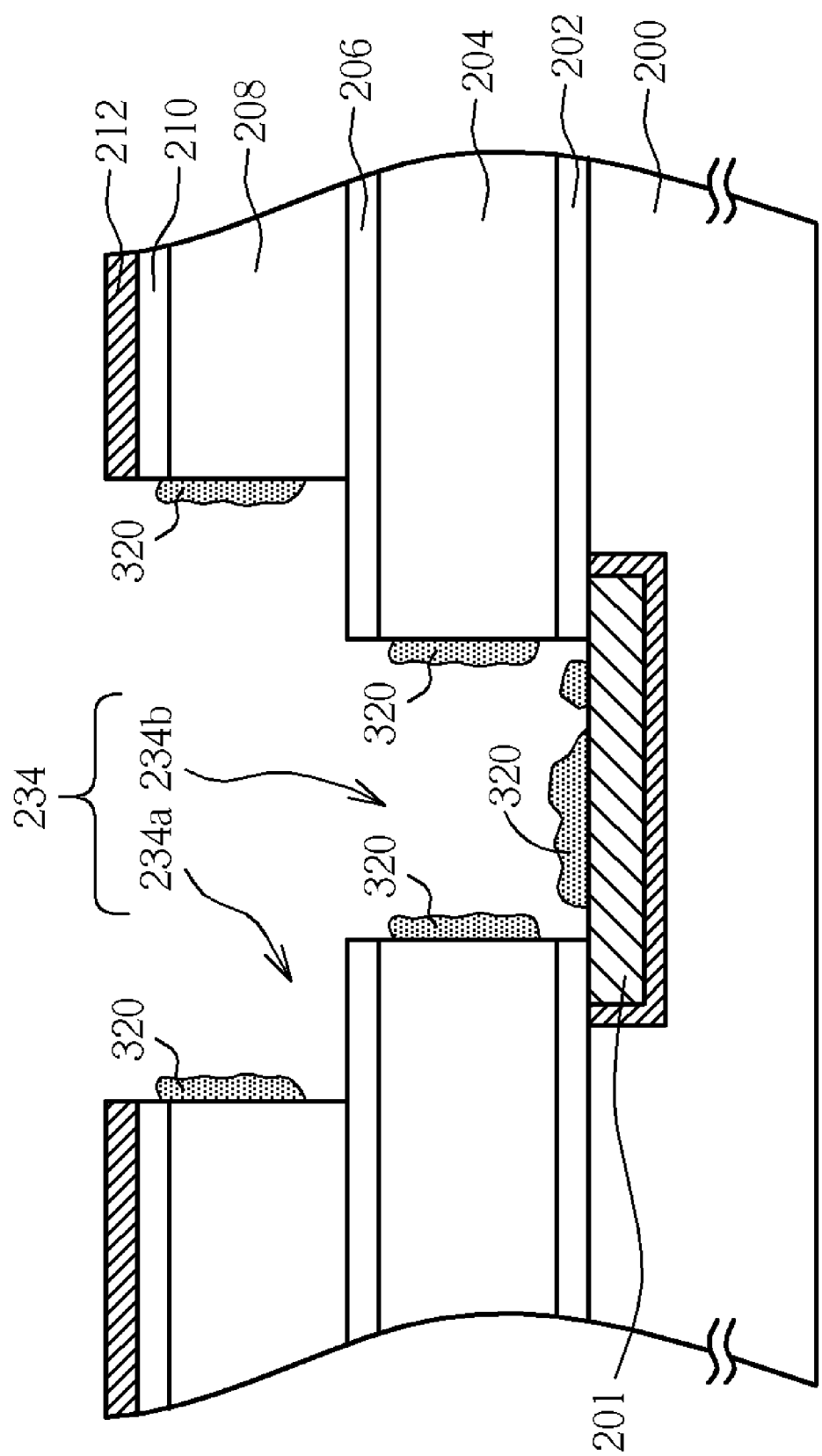

As shown in FIG. 7, using the patterned hard mask layer 214 and metal hard mask layer 212 as an etching mask, a second anisotropic etching process is performed to form a self-aligned damascene opening 234 in the first and second dielectric layers 204 and 208. The damascene opening 234 includes an upper trench opening 234a in the first dielectric layers 204 and a lower via opening 234b in the second dielectric layers 204, wherein the lower via opening 234b exposes a portion of the underlying conductive wire 201.

During the etching of the damascene opening 234, polymer residues 320 are formed on sidewalls and bottom surfaces of the damascene opening 234. As previously alluded to, since the metal hard mask is involved during the dry etching of the damascene opening 234, the composition of the polymer residues 320 is therefore complex and is difficult to be removed by conventional approaches.

Figure 8:
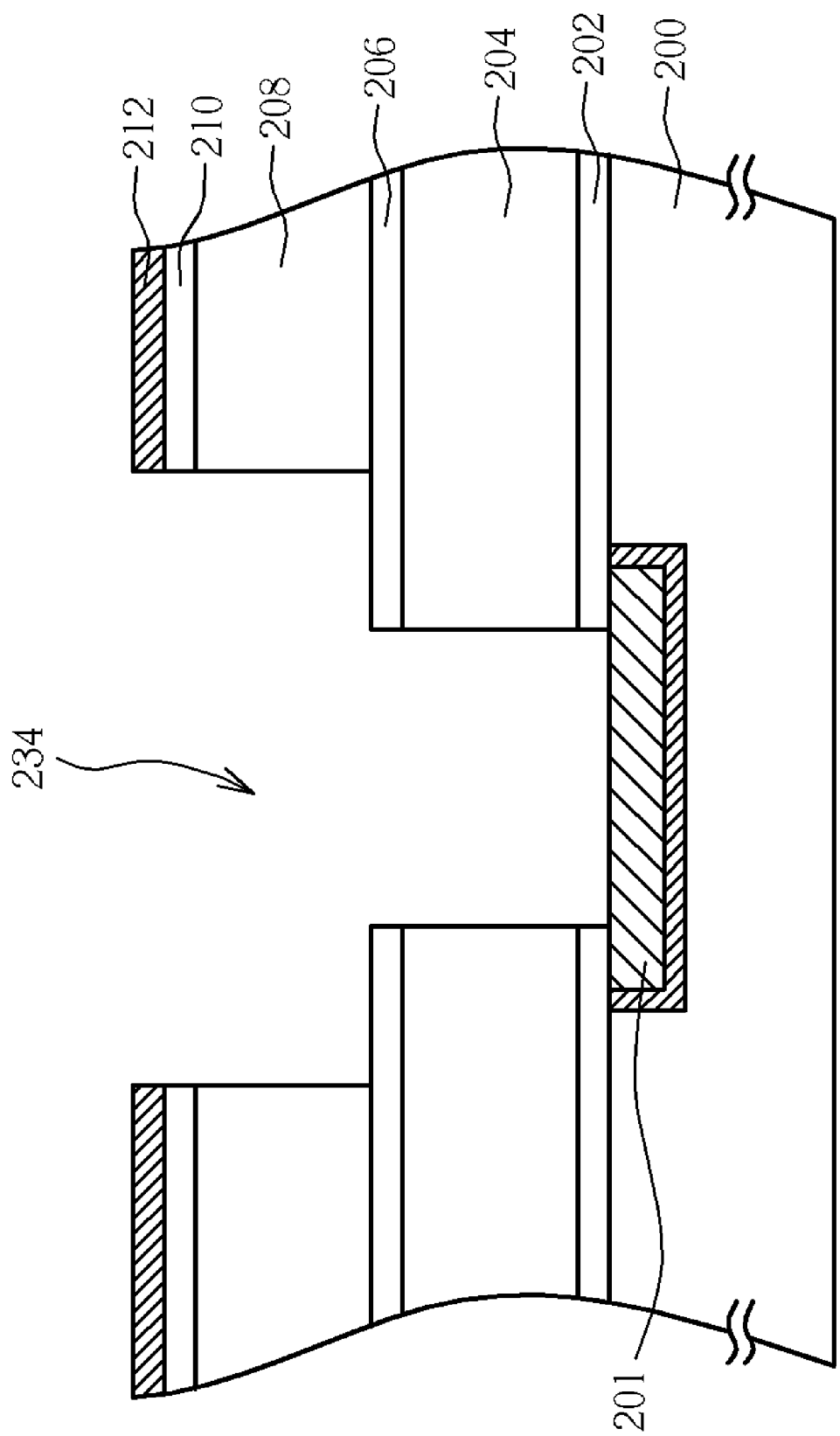

Subsequently, as shown in FIG. 8, a series of polymer removal treatment procedures are carried out to effectively and completely remove the polymer residues 320 from the surfaces of the damascene opening 234. The series of polymer removal treatment procedures are further expressed in a flow diagram of FIG. 9.

Figure 9:
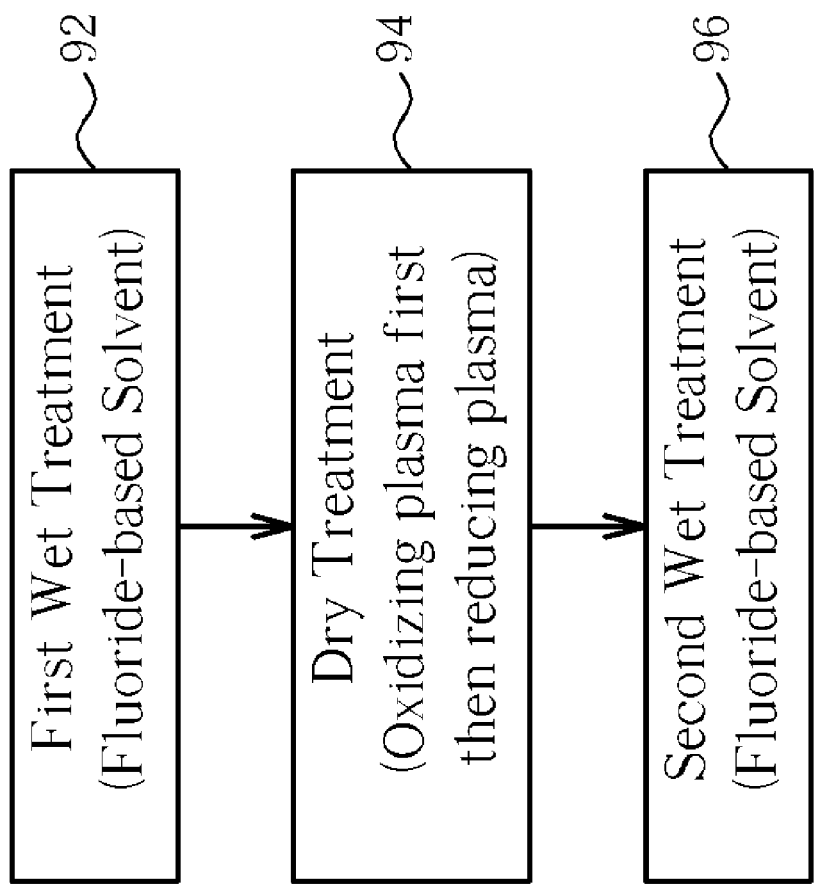
FIG. 9 is a flow diagram demonstrating one preferred embodiment according to this invention.

As shown in FIG. 9, the aforesaid series of polymer removal treatment procedures include a first fluoride-based wet treatment (Step 92), a dry treatment (Step 94), and a second fluoride-based wet treatment (Step 96). In Step 92, the wafer bearing the damascene opening 234 is dipped into a fluoride-based solvent for a period of time such as, but not limited to, 30 seconds to 90 minutes at room temperature. A thin surface layer of the polymer residues 320 as depicted in FIG. 7 may be stripped off at this stage. Nevertheless, the main purpose of the first fluoride-based wet treatment is to soften or loosen the complex structure of the polymer residues 320 such that the remaining polymer residues 320 can be effectively removed by using the succeeding steps.

After the first fluoride-based wet treatment, proceeding to Step 94, the dry treatment is carried out. Some exemplary parameters regarding the dry treatment are set forth in Table 1. During the initial 40 seconds of this example (Phases 1 and 2), as shown in Table 1, the plasma tool where the dry treatment is implemented is warmed up. The power of the plasma tool is switched from Off to 1,500W and the operating temperature is raised to 120° C. The operating pressure is tuned from initial 2.0 torrs to stabilized 0.9 torrs. Oxygen gas ($O_2$), helium gas (carrier gas), and hydrogen gas ($H_2$) are flowed into the reaction chamber (not shown) of the plasma tool. Preferably, the flowrate of oxygen is maintained at 100 microliter per minute (μlm). The flowrate of He/$H_2$ is maintained at 10,000 standard cubic centimeter per minute (sccm), preferably with a volumetric ratio of 95%(He):5% ($H_2$). During the next 30 seconds (Phase 3), the operating temperature is raised up to more than 200° C., preferably 270° C. During the succeeding 30 seconds (Phase 4), the power of the plasma tool is tuned to 1,200W.

TABLE 1

| Phase | Time (second) | Temperature (° C.) | Pressure (torr) | Power (Watts) | $O_2$ flowrate (μlm) | He/$H_2$ flowrate (sccm) |
| --- | --- | --- | --- | --- | --- | --- |
| 1 | 10 | Off | 2 | Off | 100 | 10,000 |
| 2 | 30 | 120 | 0.9 | 1,500 | 100 | 10,000 |
| 3 | 30 | 270 | 0.9 | 1,500 | 100 | 10,000 |
| 4 | 30 | 270 | 0.9 | 1,200 | 100 | 10,000 |
| 5 | 90 | 270 | 0.9 | 1,200 | 0 | 10,000 |

According to the present invention, the wafer is first treated in a comparatively mild oxidizing atmosphere with the presence of oxygen and hydrogen for about 100 seconds in order to crack and remove most of the polymer residues

320 left in the damascene opening. Some copper oxide micro particles situated at the bottom of the damascene opening, which might be initially covered by polymer or organic metal polymer substances, may now be exposed. During the aftermost 90 seconds, the wafer is then treated in a reducing atmosphere with the absence of oxygen to reduce the exposed copper oxide micro particles at the bottom of the damascene opening.

After the dry treatment, briefly referring back to FIG. 9, the wafer is exposed to a second fluoride-based wet process for a period of time such as, but not limited to, 30 seconds to 90 minutes at room temperature. The second fluoride-based wet process easily removes the rest of the polymers that have been treated with the dry plasma. Inspection of the damascene opening on the wafer shows complete removal of the polymers and post-etch residues.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for removing post-etch residues from surfaces of a wafer, comprising:
   depositing at least one low-k (k<3) dielectric film on said wafer;
   depositing a metal layer over said low-k dielectric film;
   forming a resist pattern over said metal layer;
   transferring said resist pattern to said metal layer to form a metal pattern;
   stripping said resist pattern;
   plasma etching a through hole into said low-k dielectric film by using said metal pattern as a hard mask, wherein said plasma etching causes residues to deposit within said through hole;
   performing a first wet treatment to soften said residues;
   after performing said first wet treatment, performing a plasma dry treatment to crack said residues, the plasma dry treatment comprising;
   exposing said wafer and said softened residues to an oxidizing plasma atmosphere with the presence of oxygen and hydrogen; followed by exposing said wafer and said residues to a reducing plasma atmosphere with the absence of oxygen; and
   after performing said plasma dry treatment, performing a second wet treatment to completely remove said residues.

2. The method according claim 1 wherein said first wet treatment uses fluoride-based solvent.

3. The method according to claim 1 wherein said second wet treatment uses fluoride-based solvent.

4. The method according to claim 1 wherein said metal layer comprises titanium, titanium nitride, tantalum, tantalum nitride, or any combination thereof.

5. The method according to claim 1 wherein before depositing said metal layer, a chemical mechanical polish (CMP) stop layer is deposited onto said low-k dielectric film.

6. The method according to claim 1 wherein before forming said resist pattern, a dielectric hard mask is deposited over said metal layer.

7. A method for removing post-etch residues from surfaces of a wafer, wherein said post-etch residues are formed partly due to the use of a metal hard mask during etching, said method comprising:
   performing a first wet treatment to soften said residues;
   after performing said first wet treatment, performing a plasma dry treatment to crack said residues, wherein said plasma dry treatment farther comprises two stages:
   (1) exposing said wafer and said softened residues to an oxidizing plasma atmosphere at a first temperature with the presence of oxygen and hydrogen; and
   (2) exposing said wafer and said residues to a reducing plasma atmosphere at a second temperature with the absence of oxygen;
   after performing said plasma dry treatment, performing a second wet treatment to completely remove said residues.

8. The method according to claim 7 wherein said first wet treatment uses fluoride-based solvent.

9. The method according to claim 7 wherein said second wet treatment uses fluoride-based solvent.

10. The method according to claim 7 wherein said oxidizing plasma atmosphere further includes a carrier gas.

11. The method according to claim 7 wherein said reducing plasma atmosphere is $He/H_2$ plasma.

12. The method according to claim 7 wherein said first temperature is higher than room temperature.

13. The method according to claim 7 wherein said second temperature is higher than 200° C.

14. A method for removing post-etch residues of etching damascene opening from surfaces of a wafer, wherein said post-etch residues is formed partly due to the use of a metal hard mask during etching, the damascene opening exposing a metal oxide, said method comprising:
   performing a first wet treatment to soften said residues;
   performing a plasma dry treatment to crack said residues, wherein said plasma dry treatment comprises two stages:
   (1) exposing said wafer and said softened residues to an oxidizing plasma atmosphere at a first temperature with the presence of oxygen and hydrogen; and
   (2) exposing said wafer and said residues to a reducing plasma atmosphere at a second temperature with the absence of oxygen, for the metal oxide being reduced;
   performing a second wet treatment to completely remove said residues.

15. The method according to claim 14 wherein said first wet treatment uses fluoride-based solvent.

16. The method according to claim 14 wherein said second wet treatment uses fluoride-based solvent.

17. The method according to claim 14 wherein said oxidizing plasma atmosphere further includes a carrier gas.

18. The method according to claim 14 wherein said reducing plasma atmosphere is $He/H_2$ plasma.

19. The method according to claim 14 wherein said first temperature is higher than room temperature.

20. The method according to claim 14 wherein said second temperature is higher than 200° C.

* * * * *